(12) United States Patent
Jarek

(10) Patent No.: US 6,706,454 B2
(45) Date of Patent: Mar. 16, 2004

(54) METHOD FOR THE PRODUCTION OF A PRINTING PLATE USING PARTICLE GROWING ACCELERATION BY AN ADDITIVE POLYMER

(75) Inventor: Mathias Jarek, Northeim (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 120 days.

(21) Appl. No.: 09/899,741

(22) Filed: Jul. 5, 2001

(65) Prior Publication Data

US 2003/0099888 A1 May 29, 2003

(51) Int. Cl.$^7$ ............ G03F 7/023; G03F 7/30
(52) U.S. Cl. ............ 430/18; 430/165; 430/190; 430/191; 430/192; 430/193; 430/270.1; 430/302
(58) Field of Search ............ 430/270.1, 190, 430/191, 192, 193, 165, 302

(56) References Cited

U.S. PATENT DOCUMENTS

| | | | |
|---|---|---|---|
| 3,635,709 A | 1/1972 | Kobayashi | 96/33 |
| 4,102,686 A | 7/1978 | Weinberger et al. | 96/91 |
| 4,233,390 A | 11/1980 | Jargiello | 430/156 |
| 4,350,753 A | 9/1982 | Shelnut et al. | 430/190 |
| 5,616,449 A | 4/1997 | Cheng et al. | 430/302 |
| 5,695,905 A | 12/1997 | Savariar-Hauck et al. | 430/162 |
| 5,731,127 A | 3/1998 | Ishizuka et al. | 430/270.1 |
| 5,744,272 A | 4/1998 | Elsaesser et al. | 430/96 |
| 6,051,366 A | 4/2000 | Baumann et al. | 430/281.1 |
| 6,238,831 B1 * | 5/2001 | Hauck et al. | 430/49 |

FOREIGN PATENT DOCUMENTS

| | | | |
|---|---|---|---|
| DE | 4418645 | 8/1996 | |
| DE | 19518118 | 11/1996 | |
| DE | 19825244 A1 * | 12/1999 | G03F/7/00 |
| EP | 0509523 | 10/1992 | |
| EP | 0632328 | 1/1995 | |
| EP | 0709399 | 5/1996 | |
| EP | 0733955 | 9/1996 | |
| EP | 0752430 | 1/1997 | |
| EP | 0 766 140 A1 | 2/1997 | |
| EP | 1 074 887 A1 | 7/2001 | |
| WO | 9620429 | 7/1996 | |
| WO | 9739894 | 10/1997 | |

* cited by examiner

Primary Examiner—John S. Chu
(74) Attorney, Agent, or Firm—Faegre & Benson

(57) ABSTRACT

A coating solution useful in the preparation of printing plate precursors comprises:

a) a radiation sensitive composition C comprising a phenolic resin;
b) at least one thermoplastic polymer P which has a solubility in aqueous alkaline media ranging from sparingly soluble to insoluble;
c) a first solvent component A which is capable of solubilizing both composition C and thermoplastic polymer P;
d) a second solvent component B having a volatility less than component A, wherein component B is capable of volatilizing composition C but not thermoplastic polymer P, and composition C and thermoplastic P are homogeneously dissolved in a mixture of components A and B; and
e) at least one further polymer AP having a higher molecular weight than the phenolic resin of composition C, wherein polymer AB is miscible with the phenolic resin and immiscible with thermoplastic polymer P. The coating provides a radiation-sensitive layer for the substrate, and the coating contains homogeneously distributed thermoplastic polymer particles.

26 Claims, 1 Drawing Sheet max. particle size without accelerating polymer (batch1)

max. particle size with 20% accelerating polymer (batch 2)

max. particle size without
accelerating polymer (batch1)

max. particle size with 20%
accelerating polymer (batch 2)

METHOD FOR THE PRODUCTION OF A PRINTING PLATE USING PARTICLE GROWING ACCELERATION BY AN ADDITIVE POLYMER

BACKGROUND OF THE INVENTION

1. Field of the Invention

This invention relates to radiation-sensitive coating compositions, processes for the preparation of a printing plate using such coating compositions, and printing plates prepared in such a manner. In particular, this invention relates to such compositions as well as printing plates having a radiation sensitive layer containing homogeneously distributed polymer particles. Printing plates employing such a photosensitive layer exhibit high print run stability.

2. Background Information

In recent times, the requirements with respect to the print run stability of offset printing plates have increased. For the improvement of the mechanical properties of offset plates, basically two methods have been disclosed.

One method relates to the improvement of the properties of the binders or the photosensitive composition (U.S. Pat. No. 4,102,686). This method often entails high costs due to the complexity of the synthesis regarding the preparation of such custom high-performance binders.

The other, less expensive method is the introduction of polymer particles into the radiation sensitive layer. The mechanical resistance of such particle-containing layers is often superior to that of layers with modified binders. Apart from the increase of the mechanical resistance of the layer, there are further advantages: From the literature, it is known that the chemical resistance can be increased while the exhausting times in the copying frame and the adhesiveness can be reduced. Thus far, various methods have been employed for introducing the polymer particles into the layer.

Commercially available micronized particles which are difficult to dissolve in common organic solvents (for example polyethylene, polytetrafluoroethylene, cross-linked polymethylmethacrylate or polyamide) are typically dispersed and added to the coating solution. This entails the disadvantage that these polymer particles first have to be dispersed, which constitutes an additional process step. In some areas, the particles are often distributed rather inhomogeneously after the coating has been completed. Furthermore, for particles consisting of nonpolar polymers, the adhesion to the layer is reduced. The retention time of the coating solution prepared is limited as well since these dispersions tend to form sediments or agglomerates. Furthermore, the particle dispersions cause problems in the filtering of the coating solution since the pore size of the filter cannot be smaller than the particle diameter. Starting solutions which have not been sufficiently filtered often lead to coating defects.

Another method is to prepare dispersions or emulsions of polymers by emulsion/dispersion polymerization, for example in copolymers of acrylates, styrene derivatives and other monomers, or by precipitation reaction of polymers which dissolve in common organic solvents, for example acrylonitrile butadiene styrenes (ABS) which are then added to the coating solution (U.S. Pat. Nos. 4,233,390 and 5,616, 449, EP-A-0709 399,, EP-A-0 632 328, EP-B-0 509 523).

Thus, due to the higher polarity of the polymer particles, an improved adhesion of the particles to the layer is achieved, but the above-mentioned disadvantages such as poor filterability, locally inhomogeneous distribution in the layer, and short stability of the batch remain.

Another process describes, with regard to positive working printing plates, the use of specifically developed polymers which are soluble in alkaline developers and organic media and which form a homogenous solution with the coating composition. Using a complicated drying apparatus which is difficult to operate from a process control standpoint, a separation of the binders intended for the positive plates and the polymers during drying is achieved (EP-A-0 766 140). This coating solution can be filtered since a "real" solution is present. A disadvantage of this method is that the particles are preferably formed in the upper part of the photosensitive layer, with the lower part of the layer not being protected from mechanical abrasion. Furthermore, both the drying apparatus and the polymers which form the particles have to be specifically adapted to this purpose of use, which constitutes a high cost factor. A further disadvantage of this method is that the resulting polymer particles, which are soluble in the developer, can partly be extracted from the layer by the developing step and that the remaining cavities destabilize the image areas.

In spite of the intensive research in the field of offset printing plates with high print run stability, existing approaches still require improvements, particularly with respect to easier producibility and less expensive materials.

U.S. patent application Ser. No. 09/493,837 discloses a coating composition for producing printing plates containing particles of a thermoplastic polymer in the radiation sensitive layer. The coating solution comprises a conventional positive, negative or electrophotographically radiation sensitive composition, a thermoplastic polymer soluble in organic media but insoluble in alkaline media, and two solvents which show different solubilizing properties for the thermoplastic polymer. Although the plates obtained according to this disclosure show a great improvement over the other known plates, further improvement is still desirable.

Therefore, it is the object of this invention to provide coating compositions which allow the rapid preparation of printing plate precursors, particularly lithographic printing plate precursors showing high print run stability. Additionally, the printing plate is capable development using conventional developers and exhibits high resolution. Furthermore, the ink acceptance of the printing plate is rapid and superior. Moreover, a sufficient resistance to the common purification chemicals such as benzine-based rubber blanket detergents, plate detergents etc. is provided.

SUMMARY OF THE INVENTION

The coating solution of this invention is useful in the preparation of printing plate precursors, and comprises:

a) a radiation sensitive composition C comprising a phenolic resin;

b) at least one thermoplastic polymer P which has a solubility in aqueous alkaline media ranging from sparingly soluble to insoluble, and preferably is substantially insoluble in aqueous alkaline media;

c) a first solvent component A which is capable of solubilizing composition C and thermoplastic polymer P;

d) a second solvent component B having a volatility less than component A, wherein component B is capable of solubilizing composition C but not thermoplastic polymer P, and composition C and thermoplastic polymer P are homogeneously dissolved in a mixture of components A and B; and e) at least one further polymer AP having a higher molecular weight than the phenolic resin of composition C, wherein polymer AP is miscible with the phenolic resin and immiscible with thermoplastic polymer P.

DETAILED DESCRIPTION OF THE INVENTION

Figure 1:
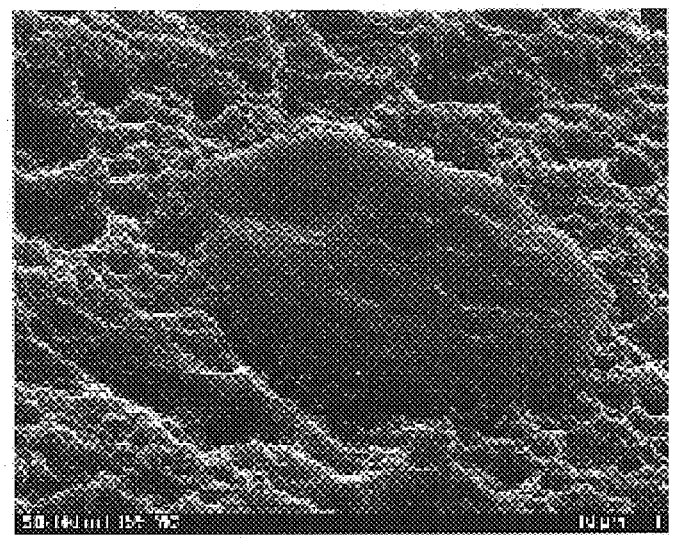
FIG. 1 shows scanning electron micrographs of printing plates prepared from batches 1 and 2, respectively.
Figure 1:
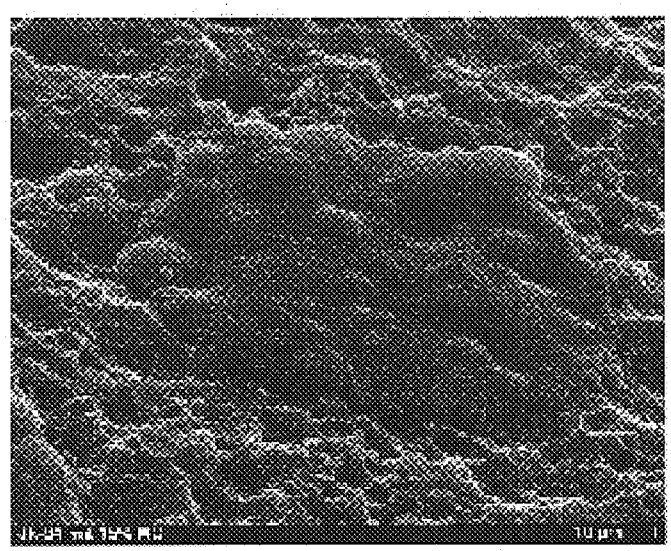

The coating solution of this invention contains 1–85%, preferably 5–75%, more preferably 10–75% of a thermoplastic polymer P which has a greater solubility in organic media than in aqueous alkaline media. More particularly, thermoplastic polymer P has a low solubility in aqueous alkaline media which ranges from sparingly soluble to insoluble. In a preferred embodiment of this invention, thermoplastic polymer P is substantially insoluble in aqueous alkaline media. In a particularly preferred embodiment, thermoplastic polymer P is insoluble in aqueous alkaline media. The thermoplastic polymer is preferably commercially available. Polymers exhibiting high abrasion stability and high tenacity values are preferred. Suitable polymers include: polystyrene (PS), styrene-acrylonitrile-copolymers (SAN), styrene-acrylonitrile-butadiene-terpolymer (ABS), acrylonitrile terpolymer, chlorinated polyethylene and styrene (ACS), acrylate-acrylonitrile-styrene-copolymers (ASA), styrene-butadiene-styrene-block-polymers (thermoplastic elastomer), styrene-isoprene-styrene-blockpolymers (thermoplastic elastomer), styrene-ethylene/butylene-styrene-blockpolymers (thermoplastic elastomer), styrene-ethylene/propylene-styrene-blockpolymers (thermoplastic elastomer), styrene maleic acid anhydride copolymers, polymethylmethacrylate (PMMA), polyalkyl (meth)acrylates, polyaryl(meth)acrylates, polyaralkyl(meth) acrylates, polycarbonates (PC), polysulfones, polyethersulfones, polyesters (soluble types), polyamides (soluble types), polyimides (soluble types), cellulose alkylester, cellulose arylester, cellulose aralkylester, polyacetale, ethylene-alkyl(meth)acrylate copolymers, polybutadiene, polyisoprene, polymethylpentene, polyvinylchloride (PVC), polyvinylcarbazole, polyvinylacetates (PVAc), ethylene-vinylacetate-copolymer (EVA), polyvinylidenechloride (PVDC), polyvinylidenefluoride (PVDF), polyurethanes (soluble types), polyalkylsiloxanes, polyarylsiloxanes, polyaralkylsiloxanes, and further types, as well as blends of the above-mentioned polymers among each other as well as copolymers of the monomers of said polymers. Particularly preferred polymers for use are PS, SAN, PC, PMMA, ABS and polysulfone.

In addition to the particle forming thermoplastic polymer P the coating solution of the present invention contains a further polymer (AP). The additional polymer must meet the following requirements: (1) it has a higher weight average molecular weight than the phenolic resin used as binder material in composition C; (2) it is compatible (i.e. miscible) with the phenolic resin; and (3) it is incompatible (i.e. immiscible) with the particle forming thermoplastic polymer P.

Any polymer meeting these requirements is suitable for use as the further polymer (AP) in the coating solution of the present invention. Preferred are homo- and copolymers derived from at least one of (meth)acrylic acid, and esters and amides thereof, and further copolymerizable monomers like (meth)acrylonitrile and N-substituted maleimides. Examples of suitable copolymers are listed in Table 1 below; however, the further polymer (AP) is not limited to the copolymers shown in Table 1.

TABLE 1

| | Monomers [wt %] | | | | | | | | | |
|---|---|---|---|---|---|---|---|---|---|---|
| copolymer | methacrylic acid | carboxyphenyl methacrylate | APK* | acrylonitril | methyl methacrylate | N-phenyl-maleimide | N-cyclohexyl-maleimide | methacrylamide | hydroxyethyl methacrylate | N-methoxy-methylmeth-acrylamide |
| AP1 | 15 | | | | | 50 | | 35 | | |
| AP2 | 20 | | | | | 45 | | 35 | | |
| AP3 | 25 | | | | | 40 | | 35 | | |
| AP4 | 30 | | | | | 35 | | 35 | | |
| AP5 | 15 | | | | | 50 | | | 35 | |
| AP6 | 15 | | | | | 50 | | | | 35 |
| AP7 | 15 | | | | | | 50 | 35 | | |
| AP8 | 9 | | | 64 | 18 | | | 9 | | |
| AP9 | 6 | | | 64 | 18 | | | 12 | | |
| AP10 | 14 | | | 60 | 16 | | | 10 | | |
| AP11 | | 15 | | | | 40 | | 45 | | |
| AP12 | | | 35 | | | 35 | | 30 | | |

*APK:

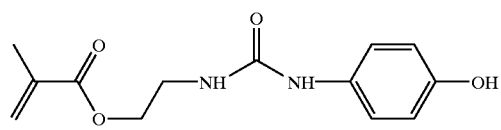

Especially preferred are copolymers comprising about 5 to 25 mole % unit I, about 20 to 80 mole % unit II, about 5 to 30 mole % unit III, about 5 to 40 mole % unit IV, and about 20 to 80 mole % unit V, with units I, II, III, IV and V being represented by the following formulae:

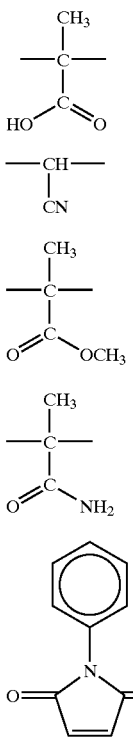

Without wishing to be bound by any one theory, it is believed that the mechanism of particle formation in this invention is as follows. Initially the polymer P, the additional polymer AP and the radiation sensitive composition C are homogeneously dissolved in the solvent mixture of A and B. In time, additional amounts of the more volatile solvent component A evaporates so that the less soluble component B accumulates. In this phase, which is still sufficiently mobile, polymer P begins to form small particles due to its incompatibility (i.e., immiscibility) with solvent B. The particles continue to grow by coalescence until the system loses so much mobility by the continuous evaporation of the solvent B that coalescence ceases. The system now consists of two phases: a matrix rich in C and AP and particles rich in P.

It has been found that the presence of the additional polymer AP has an accelerating effect on the particle growth; the polymer is therefore sometimes referred to in this application as the "accelerating polymer." The accelerating polymer AP is preferably present in the coating solution of the present invention in an amount of about 1 to 85 wt % based on the total solid content of the solution, more preferably about 2.5 to 70 wt %, most preferably about 5 to 50 wt %.

The phenolic binder resin contained in composition C preferably has a weight average molecular weight of about 1000 to 20,000, while the accelerating polymer AP preferably has a weight average molecular weight of about 20,000 to 150,000; in any case the accelerating polymer AP must have a weight average molecular weight higher than the phenolic binder resin.

The particle forming polymers are dissolved together with composition C and the accelerating polymer AP in the organic solvents A and B so that a homogeneous phase forms. A carrier such as for example an electrolytically grained and anodized alumina base, is coated with this solution. When the thin film of this solution is subsequently dried, the polymer begins to separate from the rest of the composition towards the end of the drying phase. In order for this "in-situ" particle separation to function accurately also in commercial, simply structured driers, a solvent system comprising at least two solvents must be used.

The coating composition used for the preparation of the printing plate precursors according to the invention comprises the components of a radiation-sensitive or electrophotographic composition (in the following summarized briefly as C), a more volatile solvent component A which is capable of solubilizing the components of composition C as well as the particle-forming thermoplastic polymer P and the accelerating polymer AP and a further solvent component B which is less volatile than A and is capable of solubilizing only the components of composition C wherein; however, solvent B is not capable of solubilizing polymer P to any significant extent.

Composition C must be a radiation sensitive composition which is, when employed in the preparation of a printing plate, capable of providing a radiation sensitive layer or coating. As used herein, the term "radiation sensitive" refers to a composition capable of being used in the preparation of positive working, negative working, or thermally working printing plates and the precursors of such plates. As used herein, the term "radiation" refers to any type of light (i.e. IR, UV, or UV-VIS) as well as thermal energy (i.e. heat). Composition C may be a positive or negative working radiation-sensitive system as well as an electrophotographically working system, as are described in: U.S. Pat. Nos. 5,731,127; 3,635,709; and 4,350,753 (positive working systems); DE-A-19518118, DE-A-4418645, EP-A-752430 (negative working systems); WO-A-97/39894, WO-A-96/20429 (thermally working systems); and DE-A-19510526, EP-A-733955 (electrophotographically working systems). The phenolic binder resin used in composition C is preferably a novolak resin.

As component A, the following substances can be used for example: acetone, butanone-2 (MEK), methylisobutylketone (MIBK), cyclohexanone, tetrahydrofurane (THF), dioxan, dioxolane, isobutylformate, ethylacetate, butylacetate, methyllactate, ethyllactate, ethylether, nitroethane, methylenechloride, dichloroethylene, chloroform, trichloroethane, perchloroethylene, mixtures thereof and other highly volatile solvents common in the coating technology.

As component B, the following substances can be used for example: methanol, ethanol, butanol, ethyleneglycol, methyldiglycol, ethylglycol (EC), methylglycol (MC), dimethylformamide, dimethylacetamide, N-methylpyrrolidone, dimethylsulfoxide (DMSO), methyllactate, ethyllactate, γ-butyrolactone, mixtures thereof and other solvents common in coating technology wherein the polymer is poorly soluble.

Optionally, the coating solution according to the invention may also additionally comprise a surfactant T to support the particle formation and to prevent a potential agglomeration of the particles. As surfactant T, a broad spectrum of non-ionic or ionic compounds can be used, for example alkoxylated fatty alcohols (BRIJ 78, available from Fluka/DE), alkoxylated silicones (for example EDAPLAN, available from Münzing Chemie/DE), fluorinated surfactants (for example FC 470, available from the 3M Company), and further substances that are compatible with the respective solvent system.

Several factors influence the particle size in the particle formation process. On the one hand, the process is time-dependent since the particles grow by coalescence; the faster the drying process the sooner the growth process is stopped and the smaller are the particles obtained. Thus, the time until the end of the growth step can be influenced by the performance of the drier. In commercial driers, however, the respective range is limited and furthermore requires longer retrofitting and waiting times only upon a temperature change.

Another possible parameter by which the particle size can be varied is the total solids concentration. The higher the solids concentration, the smaller are the particles that form since this corresponds to a pre-dried system. However, the variation is only slight since considerable changes in the viscosity changes of the coating solution occur and the "viscosity window" of most coaters is of narrow scope; i.e. in most coater systems, the scope is at a maximum of ±10% in the solids content of the coating solution. Depending on the coating system, the solids concentration (in % by weight, based on the coating solution) of the coating solutions according to the invention, is 0.5–50%, preferably 1–30%, particularly preferred 5–15%.

The solvent ratio A/B is easily modifiable, and has the greatest influence on the particle size. By modifying the solvent components and the solvent ratio, the particle size can be controlled within a broad range (for example from 1–10 $\mu$m). The more low-volatility component B is added with all other parameters being constant, the larger the particles obtained. The proportion (in % by weight, based on the solvent mixture of A and B) of low-volatility component B in the present invention is 1–95%, preferably 1–75%, particularly preferred 1.5–60%. The mechanical resistance increases as the particle size grows. From a certain limiting value of B in the batch, an optimum is achieved and the mechanical stability is not further improved even upon adding more B—which corresponds to a further enlargement of the particle size.

The average particle sizes, which in the present invention result in a considerable increase of the mechanical resistance, are within the range of about 0.5 to 10 $\mu$m, preferably about 0.75 to 7.5 $\mu$m. A value which is about as high as the layer thickness has turned out as optimum.

If the particles are smaller than the layer thickness, they may sink further down in the layer during the drying process, so that the upper part of the layer would not be protected against abrasion. Particles which are considerably higher than the layer thickness, i.e. the particles "growing out" of the layer, have not been observed. The particles formed have been observed as having an elliptical shape.

The number of particles and thus also the mechanical stability increases as the amount of P augments in the batch.

The thus prepared particle-containing printing plates of this invention have superior print run stability compared to common printing plates without particle formation in the radiation-sensitive layer. Particularly in positive working printing plates, the number of copies is considerably higher both in baked and non-baked printing plates than in comparable plates which do not contain polymer particles according to the present invention.

With respect to copying technique parameters such as resolution and photosensitivity, no measurable or relevant deterioration was observed with regard to the printing plates according to this invention in comparison with plates of the same composition (other than not containing the polymer which forms the particles). This also applies to the developability and the correctability of these printing plates.

The resistance to benzine-based plate and rubber detergents may also be improved in the plates according to this invention.

Besides the above advantages of the present invention the use of the accelerating polymer results in an accelerated growing of the particles so that a printing plate precursor, etc. can be prepared with a higher line speed as compared to the use of a coating composition omitting such an accelerating polymer.

This invention is further illustrated by the following example, which is not meant to limit the invention in any way.

EXAMPLE

In the following batches 1 and 2, the solid components were dissolved by a solvent mixture of 85 vol % dioxolane and 15 vol % methylglycol to a total solid concentration of 10 wt %. Details are derivable from Table 2 below. In all cases, the coating composition was transparent, i.e. there were no pre-dispersed nuclei. After filtration of the solution, it was applied to an electrochemically roughened and anodized aluminum base, which was aftertreated with polyvinyl phosphonic acid, by means of common procedures, and was first dried without air supply for 60 sec. and without heating. The afterdrying was carried out for 5 min at 100° C. The weight of the layer is given in Table 3 below.

TABLE 2

| Component | Batch 1 (comparison) [wt %] | Batch 2 [wt %] |
|---|---|---|
| Positive diazo A[1] | 16.5 | 16.5 |
| Positive diazo B[2] | 7.8 | 7.8 |
| Novolak[3] | 58.425 | 38.425 |
| Accelerating polymer[4] | 0 | 20 |
| 2,4-trichloromethyl-6-[1(4-methoxy)naphthyl]-1,3,5-triazin | 0.75 | 0.75 |
| ethyl violet | 1.5 | 1.5 |
| DG-001/2[5] | 0.025 | 0.025 |
| Particle generating polymer[6] | 15 | 15 |

[1] low molecular weight novolak esterified with 1,2-naphthoquinonediazide-4-sulfonic acid
[2] low molecular weight novolak esterified with 1,2-naphthoquinonediazide-5-sulfonic acid
[3] cresole/formaldehyde novolak resin (meta:para = 75/25), MW = 7000, available from Borden Chemical Co.
[4] copolymer synthesized from methacrylic acid, acrylonitrile, N-phenylmaleimide, methyl methacrylate and methacryl amide (molar composition: 10:70:10:5:5). MW = 53,000.
[5] fluorinated surfactant available from DIC Japan
[6] polycarbonate available from Bayer In plates precursors obtained with batches 1 and 2, the particles were well defined. The maximum particle size was below 1 $\mu$m for batch 1, while the maximum particle size of batch 2 was about 5 $\mu$m. The scanning electron micrographs are shown in FIG. 1.

The photocoating was exposed as positive copy under a silver film half-tone step greyscale (UGRA-greyscale filter) having a density range of 0.15 to 1.95, with density increments of 0.15, using a metal halide lamp (MH-burner, 5000W, available from Sack Co.) with 800 mJ/cm$^2$.

The exposed layer was treated for 15 seconds with a developer solution comprising:

- 87.79 weight % demineralized water;
- 9.20 weight % soda waterglass;
- 2.10 weight % sodium hydroxide;
- 0.90 weight % ethylene glycol; and
- 0.01 weight % tetramethyl ammonium chloride (aqueous solution, 50%).

Subsequently, the developer solution was again spread on the surface for 5 sec. with a wet piece of cloth. Then the entire plate was rinsed with water. After this treatment, the non-exposed parts remained on the plate. To assess the photosensibility and the ink acceptance, the wet plate was inked up with a printing ink. As printing ink, the products PC 904 (available from Kodak Polychrome Graphics) and RC 43 (available from Hoechst) were used.

a) Wash Resistance

A laboratory test detergent was used to test the resistance of the radiation-sensitive layer to aggressive detergents which usually contain alcohol (e.g. used for cleaning films and glass and in the pressroom for cleaning printing plates, blankets and printing rolls). This test also yielded reliable information regarding the chemical resistance to other organic solvents. The composition of the test detergent was as follows: 20% by weight of isopropanol (water content below 0.1%), 80% by weight of benzine 135/180 (also referred to as type K21) and 1% by weight of water. The final water content was determined by the Karl Fischer technique with a variation within ±0.1%.

In practice, the upper third of a printing plate sample (about 10×10 cm in size) was exposed to light and immersed into a dry Petri dish filled with the detergent and kept at about 25° C. At intervals of 1, 2, 3 and 4 min., respectively, the sample was wiped with a cloth from top to bottom, exerting high pressure. The unexposed half was evaluated. The time (in minutes) after which a marked loss in contrast (i.e. loss in contrast of about 30%) was recorded. Only in those cases in which the exposed part was resistant for more than 0.5 min was that value recorded as well.

b) Fount-Resistance

The fount was based on 16.5 w/w % isopropanol and 4.2% COMBIFIX (a fount additive from Hostmann-Steinberg). The sample was fogged in 9 steps; i.e. beginning unexposed as step 1 and fully exposed as step 9 (the step exposure was done increasing by 22.5 mJ/cm$^2$). The sample was then immersed at 25° C. for 1 hour, rinsed and dried with forced air. The tape (TESAPACK 4122, available from Beiersdorf AG) was then adhered to the sample and pulled fast. The number of the step where the coating was fully removed ("free") and the number of the ("solid") step where the step was as shiny as the step below, even if it appeared a bit bleached, was noted.

c) Abrasion Test

The printing plates were subjected to an abrasion test which provided information about the mechanical abrasion resistance of the layer. In this test, a piece of cloth soaked with an aqueous abrasive suspension was rubbed over the printing plate with oscillating movements for a predefined period of time (15 min.). This test was carried out in thermally untreated (non-baked) and thermally treated (baked) plates. The baked samples were heated to 250° C. in an oven for 8 min. In the non-baked samples, a fine-grained abrasive was used, whereas a coarse-grained abrasive was used for the baked samples. The lower the weight losses in this method, the higher was the mechanical resistance of a sample. This test was adjusted via the selection of the abrasive emulsion such that a qualitative prediction regarding the number of copies of the printing plate in a printing machine could be made.

The results of the above-explained tests are shown in Table 3 below.

TABLE 3

|  | Virage ®* | T-46 ®* | plate with batch 2 | plate with batch 1 |
|---|---|---|---|---|
| speed at 280 units [UGRA free] | 3.33/15 | 2.66/13.5 | 3/11 | 3.33/11 |
| fount resistance [solid/free step] | 2/4 | n.d. | 10/10 | 8/10 |
| wash resistance [min] | 0.5 | n.d. | >4 | 1 |
| coating weight [g/m$^2$] | 2.35 | 2.50 | 2.39 | 2.32 |
| abrasion unbaked [weight-loss in g] | 1.02 | 0.21 | 0.11 | 0.21 |
| abrasion baked [weight-loss in g] | 0.74 | 0.32 | 0.39 | 0.41 |

*commercial printing plate available from Kodak Polychrome Graphics which contains no particles in the radiation sensitive layer.
n.d. = not determined As is apparent from Table 3 above, the plates according to this invention containing relatively large particles showed an increase of the mechanical stability compared to plates not containing particles and the plate containing small particles. Furthermore, the fountain resistance and wash resistance of the plate according to this invention were excellent. In addition, the plate prepared with batch 2 (i.e. a plate according to this invention) could be prepared with a line speed of about 40 m/min., whereas the use of batch 1 required a lower line speed, i.e. about 15 m/min.

Although this invention has been illustrated by reference to specific embodiments, it will be apparent to those skilled in the art that various changes and modifications may be made which clearly fall within the scope of this invention.

The invention claimed is:

1. A radiation sensitive coating solution comprising:
   a) a radiation sensitive a composition comprising a phenolic resin;
   b) at least one thermoplastic polymer which has a solubility in aqueous alkaline media ranging from sparingly soluble to insoluble;
   c) a first solvent which is capable of solubilizing both the radiation sensitive composition and the thermoplastic polymer;
   d) a second solvent having a volatility less than the first solvent, wherein the second solvent is capable of solubilizing the radiation sensitive composition but not the thermoplastic polymer, and the radiation sensitive composition and the thermoplastic polymer are homogeneously dissolved in a mixture of the first and second solvents; and
   e) a copolymer including at least one unit derived from (meth)acrylic acid or an aster or amid thereof, and at least one unit derived from acrylonitrile or an N-substituted maleimide, wherein the copolymer has a higher molecular weight than the phenolic resin of the radiation sensitive composition, and wherein the copolymer is miscible with the phenolic resin and immiscible with the thermoplastic polymer.

2. The coating solution according to claim 1 wherein the thermoplastic polymer is at least one of polystyrene, styrene acrylonitrile copolymer, polycarbonate, polymethylmethacrylate, polyvinylchloride, polymethylpentene, acrylonitrile-butadiene-styrene terpolymer or polysulfone.

3. The coating solution according to claim 1, wherein the radiation sensitive composition comprises a novolak resin.

4. The coating solution according to claim 1, wherein the copolymer includes at least one of (meth)acrylic acid, APK, methyl(meth)acrylate or (meth)acrylamide, and at least one of (meth)acrylonitrile, or an n-substituted maleimide.

5. The coating solution according to claim 1, wherein the amount of the thermoplastic polymer P is about 1 to 85 wt % based on the total solid content of the coating solution.

6. The coating solution according to claim 1, wherein the radiation sensitive composition is a positive or negative working composition.

7. The coating solution according to claim 1, wherein the amount of the copolymer is about 1 to 85 wt % based on the total solid content of the coating solution.

8. The coating solution according to claim 1, wherein the amount of the first solvent plus the second solvent is about 50 to 99 wt % based on the total coating solution.

9. The coating solution according to claim 1, wherein the solution additionally comprises a surfactant.

10. A process for the preparation of a printing plate precursor, comprising:
a) providing an optionally pre-treated substrate;
b) applying a coating solution comprising:
   i) a radiation sensitive composition comprising a phenolic resin,
   ii) at least one thermoplastic polymer which has a solubility in aqueous alkaline media ranging from sparingly soluble to insoluble,
   iii) a first solvent which is capable of solubilizing both the radiation sensitive composition and the thermoplastic polymer,
   iv) a second solvent having a volatility less than the first solvent, wherein the second solvent is capable of solubilizing the radiation sensitive composition but not the thermoplastic polymer, and the radiation sensitive composition and the thermoplastic polymer are homogeneously dissolved in a mixture of the first and second solvents, and
   v) at least one copolymer including at least one unit derived from (meth)acrylic acid or ester or amide thereof, and at least one unit derived from acrylonitrile or an N-substituted maleimide, wherein the copolymer AP has a higher molecular weight than the phenolic resin of the radiation sensitive composition, and wherein the copolymer is miscible with the phenolic resin and immiscible with the thermoplastic polymer,
c) drying the coated substrate to provide thermoplastic polymer particles; and
d) optionally baking the coated substrate.

11. The process according to claim 10, wherein the thermoplastic polymer is at least one of polystyrene, styrene acrylonitrile copolymer, polycarbonate, polymethylmethacrylate, polyvinylchloride, polymethylpentene, acrylonitrile-butadiene-styrene terpolymer or polysulfone.

12. The process according to claim 10, wherein the radiation sensitive composition comprises a novolak resin.

13. The process according to claim 10, wherein the copolymer includes at least one of (meth)acrylic acid, APK, methyl(meth)acrylate or (meth)acrylamide, and at least one of (meth)acrylonitrile, or n-substituted maleimides.

14. The process according to claim 10, wherein the amount of the thermoplastic polymer is about 1 to 85 wt % based on the total solid content of the coating solution.

15. The process according to claim 10, wherein the amount of the copolymer is about 1 to 85 wt % based on the total solid content of the coating solution.

16. The process according to claim 10, wherein the radiation sensitive composition is a positive or negative working composition.

17. The process according to claim 10, wherein the amount of the first solvent plus the second solvent is about 50 to 99 wt % based on the total coating solution.

18. The process according to claim 10 wherein the substrate is an optionally pretreated aluminum sheet.

19. A printing plate precursor obtained by a process comprising:
a) providing an optionally pre-treated substrate;
b) applying a coating solution comprising:
   i) a radiation sensitive composition comprising a phenolic resin,
   ii) at least one thermoplastic polymer which has a solubility in aqueous alkaline media ranging from sparingly soluble to insoluble,
   iii) a first solvent which is capable of solubilizing both the radiation sensitive composition and the thermoplastic polymer,
   iv) a second solvent having a volatility less than the first solvent, wherein the second solvent is capable of solubilizing the radiation sensitive composition but not the thermoplastic polymer, and the radiation sensitive composition and the thermoplastic polymer are homogeneously dissolved in a mixture of the first and second solvents, and
   v) at least one copolymer including at least one unit derived from (meth)acrylic acid or an ester or amide thereof, and at least one unit derived from acrylonitrile or an N-substituted maleimide, wherein the copolymer has a higher molecular weight than the phenolic resin of the radiation sensitive composition, and wherein the copolymer is miscible with the phenolic resin and immiscible with thermoplastic polymer;
c) drying the coated substrate to provide thermoplastic polymer particles; and
d) optionally baking the coated substrate.

20. The printing plate precursor according to claim 19, wherein the radiation sensitive composition comprises a novolak resin.

21. The printing plate precursor according to claim 19, wherein the substrate is an optionally pretreated aluminum sheet.

22. The printing plate precursor according to claim 19, wherein the precursor comprises a radiation-sensitive layer containing particles of the thermoplastic polymer having an average diameter of about 0.5 to 15 $\mu$m.

23. The printing plate precursor according to claim 19 wherein the precursor comprises a radiation sensitive layer and the particle diameter corresponds to the layer thickness of the radiation-sensitive layer.

24. A printing plate obtained by a process comprising:
a) providing an optionally pre-treated substrate,
b) applying a coating solution comprising
   i) a radiation sensitive composition comprising a phenolic resin,
   ii) at least one thermoplastic polymer which has a solubility in aqueous alkaline media ranging from sparingly soluble to insoluble,
   iii) a first solvent which is capable of solubilizing both the radiation sensitive composition and the thermoplastic polymer, and iv) a second solvent having a volatility less than the first solvent, wherein the second solvent is capable of solubilizing the radiation sensitive composition but not the thermoplastic polymer, and the radiation sensitive composition and the thermoplastic polymer are homogeneously dissolved in a mixture of the first and second solvents, and v) at least one copolymer including at least one unit derived from acrylic acid or an ester or amide thereof, and at least one unit derived from (meth) acrylonitrile or an N-substituted maleimide, wherein the copolymer has a higher molecular weight than the phenolic resin of the radiation sensitive composition, and wherein the copolymer is miscible with the phenolic resin and immiscible with the thermoplastic polymer;

c) drying the coated substrate to provide thermoplastic polymer particles;

d) optionally baking the coated substrate;

e) imagewise exposing the coated substrate; and f) developing the imagewise exposed substrate.

25. The coating solution of claim 1 wherein the copolymer includes Units I–V, wherein Units I–V are represented by the formulae:

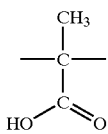
(I)

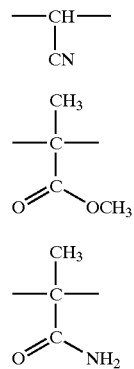
(II)

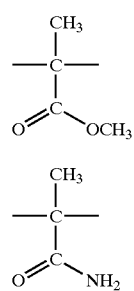
(III)

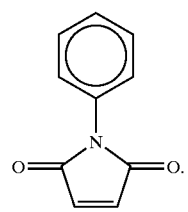
(IV)

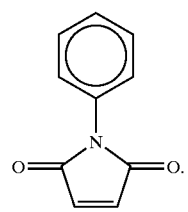
(V)

26. The coating solution of claim 25 comprising about 5 to about 25 mole percent Unit I, about 20 to about 80 mole percent Unit II, about 5 to about 30 mole percent Unit III, about 5 to about 40 mole percent Unit IV, and about 20 to about 80 mole percent unit V.

* * * * *

UNITED STATES PATENT AND TRADEMARK OFFICE
CERTIFICATE OF CORRECTION

PATENT NO.   : 6,706,454 B2
DATED        : March 16, 2004
INVENTOR(S)  : Mathias Jarek It is certified that error appears in the above-identified patent and that said Letters Patent is hereby corrected as shown below:

Column 5,
Delete equation (v) and replace it with

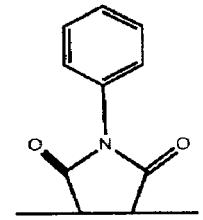

Column 11,
Line 8, after the word "polymer" delete the letter "P".
Line 45, after the word "copolymer" delete the letters "AP".

Column 14,
Delete equation (v) and replaec it with

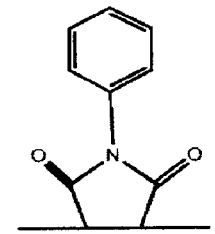

Signed and Sealed this

Sixth Day of July, 2004

JON W. DUDAS
*Acting Director of the United States Patent and Trademark Office*